United States Patent [19]

Omura et al.

[11] Patent Number: 4,847,845
[45] Date of Patent: Jul. 11, 1989

[54] SEMICONDUCTOR LASER WITH AN INTERPOSED GAP

[75] Inventors: Etsuji Omura; Hirofumi Namizaki, both of Itami, Japan

[73] Assignee: Mitsubishi Denki Kabushiki Kaisha, Japan

[21] Appl. No.: 130,426

[22] Filed: Dec. 9, 1987

[30] Foreign Application Priority Data

Feb. 27, 1987 [JP] Japan .................................. 62-45632

[51] Int. Cl.$^4$ .............................................. H01S 3/19
[52] U.S. Cl. ........................................ 372/46; 372/45; 372/48
[58] Field of Search ....................... 372/43, 44, 45, 46, 372/48, 96

[56] References Cited

U.S. PATENT DOCUMENTS

| 3,833,435 | 9/1974 | Logan et al. | 372/45 |
| 3,865,646 | 2/1975 | Logan et al. | 372/45 |
| 3,883,219 | 5/1975 | Logan et al. | 372/45 |

FOREIGN PATENT DOCUMENTS

| 0058784 | 4/1983 | Japan | 372/96 |
| 0124183 | 7/1984 | Japan | 372/48 |
| 0235484 | 11/1985 | Japan | 372/48 |

OTHER PUBLICATIONS

"Design and Implementation of High-Speed InGaAsP Constricted-Mesa Lasers", Conference on Optical Fiber Communication, Technical Digest, 24–26, Feb., 1986.
IEEE Journal of Light-wave Technology, Sakakibara et al., vol. LT-3, No. 5, Oct. 1985, pp. 978–984.

*Primary Examiner*—William L. Sikes
*Assistant Examiner*—B. R. R. Holloway
*Attorney, Agent, or Firm*—Leydig, Voit & Mayer

[57] ABSTRACT

A semiconductor laser includes a semiconductor substrate on which a first semiconductor layer forming a rectifying junction is disposed, a groove extending through the first layer and into the substrate, a first cladding layer disposed on the semiconductor substrate in the groove, an active layer provided on the first cladding layer in the groove, and a second cladding layer provided directly on the active layer and opposite the first semiconductor layer, with an interposed gap void of solid material or an interposed gap and a current blocking material having only negligible parasitic capacitance disposed at spaced locations in the gap.

8 Claims, 4 Drawing Sheets

4,847,845

SEMICONDUCTOR LASER WITH AN INTERPOSED GAP

FIELD OF THE INVENTION

The present invention relates to a semiconductor laser and, more particularly, to an improvement in the response speed thereof.

BACKGROUND ART

An InGaAsP system embedded type semiconductor laser is generally as light source used in a light communication for long distance and large capacity transmission. FIG. 6 shows a cross-section of a prior art embedded type semiconductor laser, which is called a Buried Crescent (hereinafter referred to as "BC") laser. The BC laser is described in detail in IEEE Journal of Lightwave Technology, Vol. LT-3, p. 978, 1985.

In FIG. 6, the reference numeral 1 designates a substrate comprising p type InP. The numeral 2 designates a first current blocking layer comprising n type InP. The numeral 3 designates a second current blocking layer comprising p type InP. The numeral 4 designates a first cladding layer comprising p type InP. The numeral 5 designates an active layer. The numeral 6 designates a second cladding layer comprising n type InP. The numeral 7 designates a p type electrode. The numeral 8 designates an n type electrode. The numeral 9 designates a pn junction region.

The semiconductor laser of FIG. 6 is produced in a sequence of steps.

A first current blocking layer 2 and a second current blocking layer 3 are successively grown on the substrate 1. Next, a groove having an arrowhead configuration is produced in the <011> direction, usually, by photolithography and chemical etching. Hydrochloric acid is used for the etching. The width of the groove is established at a value less than 2 μm so that the transverse oscillation may be a single fundamental mode.

Next, the first cladding layer 4 and the active layer 5 are successively grown on the substrate 1 in the groove, and thereafter a second cladding layer 6 is grown on the active layer 5 and the second current blocking layer 3.

After the second crystal growth is concluded, a p electrode 7 such as AuZn or Au, is deposited on the substrate 1 opposite blocking layer 2, an n electrode 8 such as AuGe or Au is deposited on the second cladding layer 6 opposite blocking layer 3 to complete a BC laser as shown in FIG. 6.

When a bias voltage is applied to the electrodes so that the n electrode 8 is negative relative to electrode 7, the pn junction produced by the active layer 5 (which is normally p type) and the second cladding layer 6 becomes forward biased. The pn junction region 9 produced by the first current blocking layer 2 and the second current blocking layer 3 becomes reverse biased. Accordingly, the path of the current flowing through the chip is restricted to the substrate 1, the first cladding layer 4, the active layer 5, and the second cladding layer 6. Current does not flow through any region other than active layer 5. As a result, almost all the current inside the chip is concentrated on the active layer 5, thereby contributing to the laser oscillation. Thus, a low threshold current, such as lower than 20 mA, is realized in the BC laser.

In the BC laser described above, reverse bias junctions are provided on both sides of the active layer 5 in order to concentrate current flow in a so-called embedded type low threshold current semiconductor laser.

That construction has a large capacitive component from the reverse bias junctions. Since the RC time constant of the laser is large because this capacitive component functions as a parasitic capacitance, the frequency response of a semiconductor laser employing this structure has been restricted to a value lower than a few hundred MHz.

SUMMARY OF THE INVENTION

An object of the present invention is to provide an improved semiconductor laser capable of oscillating at a low threshold current value and having a high speed response.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, current is concentrated in an active layer by blocking current flow with a gap void of solid material or such a gap partially or entirely filled with current blocking material having only negligible parasitic capacitance, so that the parasitic capacitance is small and high speed response at a low threshold current is achieved.

DETAILED DESCRIPTION OF THE PREFERRED EMBODIMENTS

Figure 1:
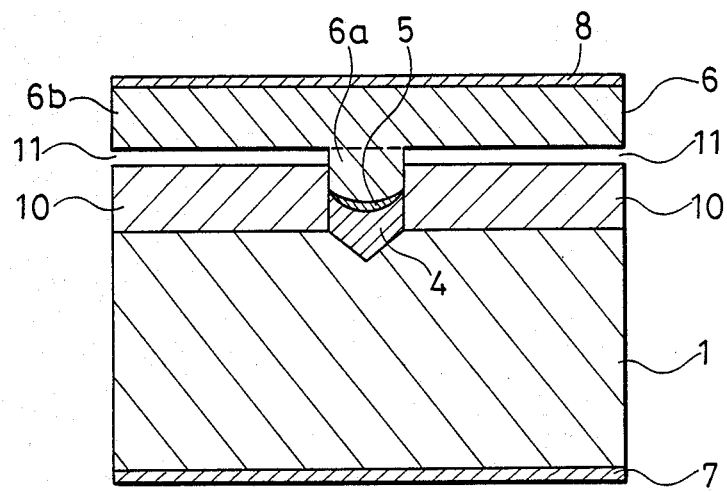
FIG. 1 is a cross-sectional view showing a semiconductor laser according to an embodiment of the present invention.
Figure 2:
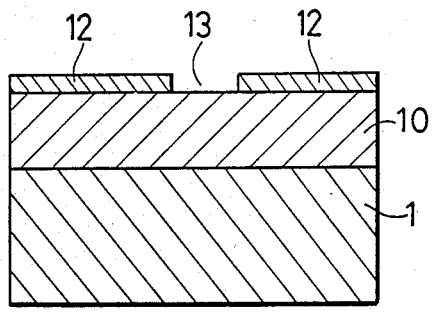
FIGS. 2(a)-2(d) are diagrams showing a method of producing the semiconductor laser of FIG. 1.
Figure 2:
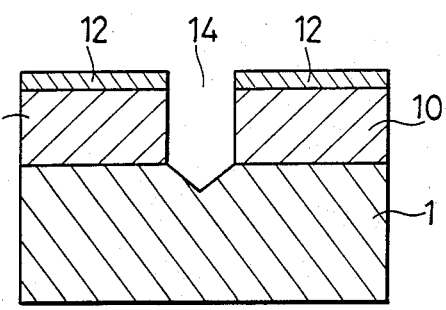
Figure 2:
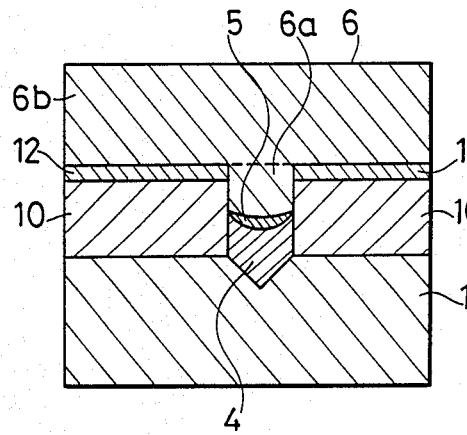
Figure 2:
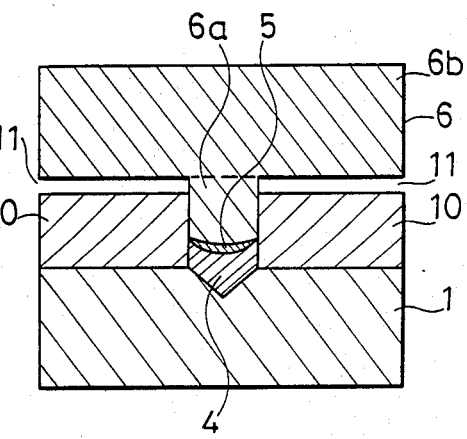
Figure 6:
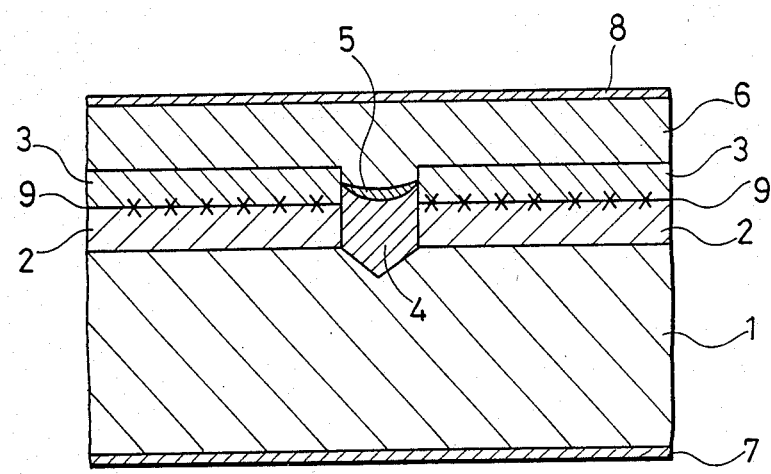
FIG. 6 is a cross-sectional view showing a prior art semiconductor laser.

In FIG. 1, the same reference numerals designate the same elements as those shown in FIG. 6. The reference numerals 6a and 6b designate respectively a current concentration region and a current dispersion region of the second cladding layer 6. The reference numeral 10 designates a current blocking layer comprising n type InP. The reference numeral 11 designates a gap that is void of solid material.

FIGS. 2(a)-2(d) show a method of producing the semiconductor laser of FIG. 1.

In these figures, the same reference numerals designate the same elements as those shown in FIG. 1. The reference numeral 12 designate a mask layer comprising InGaAsP, the reference numeral 13 designates a longitudinal groove in substrate 1 and layer 10 and the reference numeral 14 designates a longitudinal groove in substrate 1 and layer 10.

Current blocking layer 10 and a selectively removable mask layer 12 are successively grown on the substrate 1. Their thicknesses are about 2 μm and 1 μm, respectively.

Next, a photoresist (not shown) is deposited on the mask layer 12, and a longitudinal window of about 2 μm width is produced in the <011> direction on the photoresist. Thereafter a longitudinal window 13 is produced in the mask layer 12 with the photoresist as a mask by etching with solution of sulfuric acid, hydrogen peroxide, and water or hydrochloric acid, acetic acid, and hydrogen peroxide (refer to FIG. 2(a)).

Next, a longitudinal groove 14 reaching the substrate 1, is formed with layer 12 as a mask by etching such as with hydrochloric acid. Hydrochloric acid is suitable as an etchant for selectively etching InP with InGaAsP as a mask because hydrochloric acid only etches InP and does not etch InGaAsP (refer to FIG. 2(b)).

Next, layer 4 is grown on the substrate 1 in the groove 14 by a conventional method. The first cladding layer 4 and the active layer 5 are successively grown. The second cladding layer 6 is grown on the active layer 5 and on the mask layer 12 (refer to FIG. 2(c)).

Next, the structure is selectively etched with a solution of sulfuric acid, hydrogen peroxide, and water or a solution of potassium ferrocyanide, potassium hydroxide, and water, both of which only etch InGaAsP and not InP. The etchant cuts into the wafer from the both sides, and etches only the mask layer 12 comprising InGaAsP. Etching automatically stops when it has advanced to the second cladding layer 6 on the active layer 5. At the conclusion of the etching, a gap 11 void of solid material is produced that extends close to the active layer 5 (refer to FIG. 2(d)).

Gap 11 up to a position quite close to the active layer 5, and this space 11, as a matter of course, functions as an insulating layer, so that current flowing directly from the substrate 1 through the current blocking layer 10 is completely cut off from reaching the current dispersion region 6b at the upper portion of the second cladding layer 6. As a result, the current flows to the current dispersion region 6b only through the active layer 5 and the current concentration region 6b, thereby attaining a reduced threshold value.

Furthermore, the capacitance due to gap 11 is negligibly small for the high frequency component, and the limitations of modulation speed by the RC time constant is negligible. Therefore, a high speed response of above 10 GHz is achieved.

In the above-described production method, the material for the mask layer 12, which is to be removed by etching, must be different from the materials of the current blocking layer 10 and the second cladding layer 6 surrounding the mask layer 12. The selective etching of mask layer 12 is automatically concluded after the second cladding layer 6 overlying the active layer is reached. Accordingly, there is no necessity of employing a high technology in the production process, and the gap 11 is produced with good reproducibility.

Furthermore, the selective etching proceeds from the both sides of the wafer. Therefore, the transverse width of the current dispersion region 6b at the upper portion of the second cladding layer 6 above the active layer 5 can be wider than the active region so that a good ohmic contact is easily obtained on the second cladding layer 6.

Figure 3:
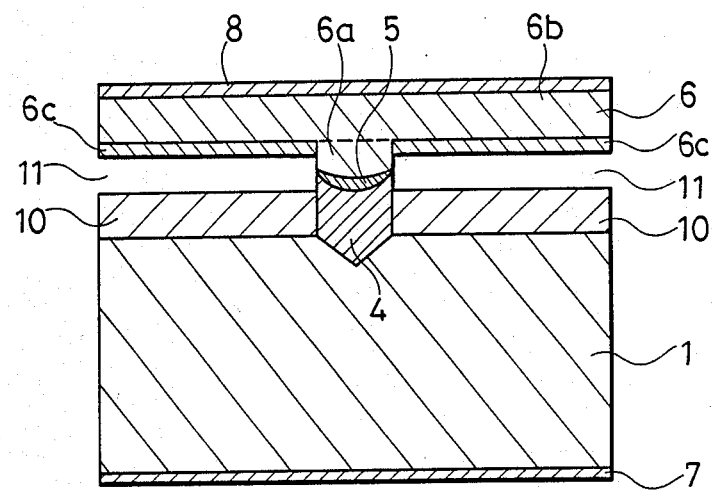
FIG. 3 and FIG. 4 are cross-sectional views showing still other embodiments of semiconductor lasers according to the present invention.

FIG. 3 shows a cross-section of another semiconductor laser embodiment according to the present invention. In FIG. 3, the same reference numerals as those shown in FIG. 1 designate the same elements, and the reference numeral 6c designates a p type semiconductor layer integrated with the second cladding layer 6.

In the above-described first embodiment, a mask layer 12 is produced by an initial crystal growth, and thereafter a longitudinal groove 14 is produced by an etching. In the embodiment of FIG. 3, a p type semiconductor layer 6c comprising, for example, p type InP is further provided on the mask layer 12 in the initial crystal growth.

In the embodiment of FIG. 3, since p type semiconductor layer 6c has a different conductivity type from that of the second cladding layer 6, the electrical isolation between the current dispersion region 6c and the current blocking layer 10 is improved relative to the embodiment of FIG. 1.

Figure 4:
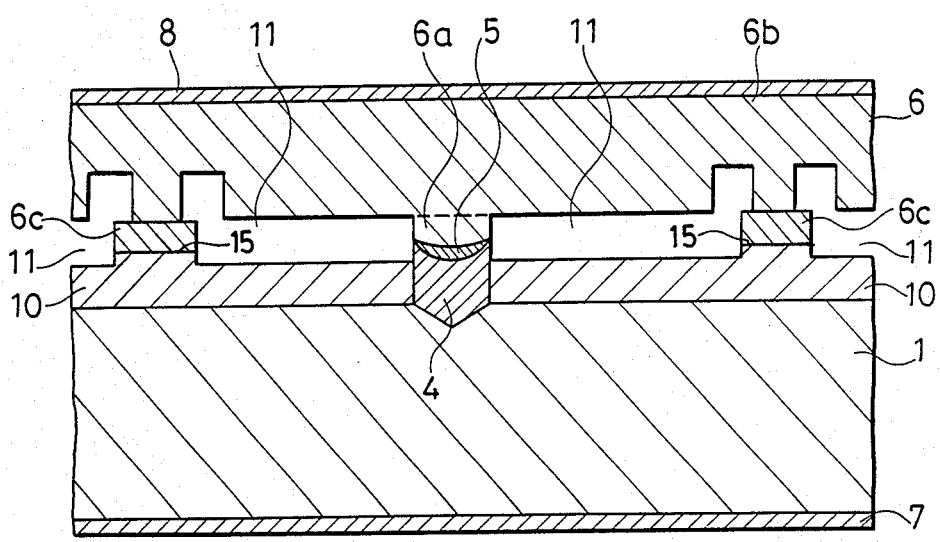

Furthermore, the semiconductor lasers shown in FIG. 1 and FIG. 3 include a slender region comprising the first cladding layer 4, the active layer 5, and the current concentration region 6a at the lower portion of the second cladding layer 6. The slender portion supports the relatively wide current dispersion region 6b of the wide second cladding layer 6, raising concern that the structure is mechanically weak. Those concerns are avoided in the embodiment of the present invention shown in FIG. 4. There, a p type semiconductor layer 6c, which functions as current blocking material having a negligible quantity of parasitic capacitance, may be provided at spaced locations between current blocking layer 10 and current dispersion region 6b. Alternatively, an insulator 15 such as SiO$_2$ or high molecular material such as polyimide may be provided at spaced locations between the current blocking layer 10 and the current dispersion region 6b of the second cladding layer 6, thereby enhancing the strength of a chip.

The same elements as those shown in FIG. 1, and the reference numeral 15 designates an insulating layer.

Figure 5:
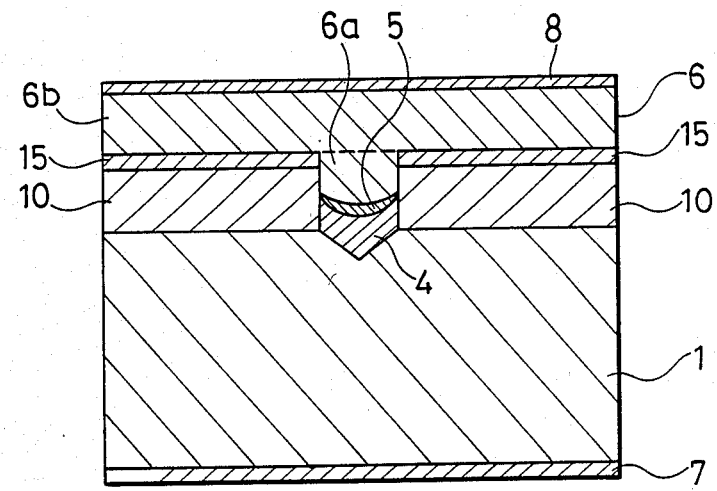
FIG. 5 is a cross-sectional view showing a semiconductor laser embodiment according to the present invention.

In the semiconductor laser of FIG. 5, the insulation between the current blocking layer 10 and the current dispersion region 6b above the second cladding layer 6 is provided by an insulating layer 15. Parasitic capacitance seldom arises and a high speed response is achieved as in the embodiment of FIG. 1.

Insulating layer 15 can be deposited directly on the current blocking layer 10 after the initial crystal growth. Insulator 15 can also by produced by inserting a resin into the gap 11 of FIGS. 1 and 2.

While the novel semiconductor laser the InP series is described above, the present invention may be applied to semiconductor lasers of other materials such as GaAs/AlGaAs.

The present invention can be also applied to a semiconductor laser having a structure of reverse conductivity types to those of the above-described embodiments.

As is evident from the foregoing description, according to an aspect of the present invention, a semiconductor laser includes a semiconductor substrate, a longitudinal groove formed in the substrate in the resonator direction, a current blocking layer disposed on the region of the semiconductor substrate where a groove is not provided, a first cladding layer disposed on the semiconductor substrate in the groove, an active layer disposed on the first cladding layer, and a second cladding layer disposed directly on the active layer and on the current blocking layer via a gap or via a gap and current blocking material having negligible parasitic capacitance, whereby the device is capable of a high speed response.

What is claimed is:

1. In a semiconductor laser comprising:
   a semiconductor substrate of a first conductivity type;
   a first semiconductor layer of a second conductivity type different from said first conductivity type and disposed on said semiconductor substrate to form a rectifying junction therewith, said first layer containing a groove extending through said first layer and into said substrate;
   a first semiconductor cladding layer of said first conductivity type disposed in said groove in contact with said substrate;
   an active semiconductor layer disposed on said first cladding layer;
   a second semiconductor cladding layer of said second conductivity type disposed on said active layer and opposite said first semiconductor layer wherein said second cladding layer is separated from said first semiconductor layer, except at said groove, by a gap; and
   first and second electrodes respectively disposed on said substrate and said second cladding layer.

2. The laser of claim 1 including a third semiconductor layer of said first conductivity type disposed on said second cladding layer adjacent said gap.

3. The laser of claim 1 including semiconductor regions of said first conductivity type disposed at spaced locations between and contacting said first semiconductor layer and said second cladding layer.

4. The laser of claim 1 including an electrical insulator disposed at spaced locations between and contacting said second cladding layer and said first semiconductor layer, thereby defining a plurality of gaps between said second cladding layer and said first semiconductor layer, said gaps being separated by said insulator.

5. The laser of claim 4 wherein said electrical insulator is selected from the group consisting of silicon dioxide and polyimide.

6. The laser of claim 1 wherein said substrate, said first semiconductor layer, and said first and second cladding layers are indium phosphide.

7. The laser of claim 6 wherein said first conductivity type is p type.

8. The laser of claim 6 wherein said active layer is InGaAsP.

* * * * *